United States Patent [19]

Aronsson et al.

[11] Patent Number: 4,764,434

[45] Date of Patent: Aug. 16, 1988

[54] DIAMOND TOOLS FOR ROCK DRILLING AND MACHINING

[75] Inventors: Sven B. Aronsson, Stocksund; Mats G. Waldenstrom, Bromma, both of Sweden

[73] Assignee: Sandvik Aktiebolag, Sandviken, Sweden

[21] Appl. No.: 66,475

[22] Filed: Jun. 26, 1987

[51] Int. Cl.$^4$ ............................................... B22F 7/04
[52] U.S. Cl. ..................................... 428/565; 75/244; 419/11; 419/13; 125/39; 428/408; 428/698; 428/908.8
[58] Field of Search ................. 125/39; 428/408, 698, 428/908.8, 565; 419/13, 11; 75/244

[56] References Cited

U.S. PATENT DOCUMENTS

| | | | |
|---|---|---|---|
| Re. 32,380 | 3/1987 | Wentorf, Jr. et al. | 407/119 |
| 2,941,248 | 6/1960 | Hall | 18/16.5 |
| 3,136,615 | 6/1964 | Bovenkerk et al. | 51/307 |
| 3,141,746 | 6/1964 | De Lai | 51/307 |
| 3,233,988 | 2/1966 | Wentorf, Jr. et al. | 51/307 |
| 3,239,321 | 3/1966 | Blainey et al. | 51/309 |
| 3,407,445 | 10/1968 | Strong | 18/34 |
| 3,745,623 | 7/1973 | Wentorf, Jr. et al. | 29/95 |
| 3,767,371 | 10/1973 | Wentorf, Jr. et al. | 51/307 |
| 4,063,909 | 12/1977 | Mitchell | 51/309 |
| 4,108,614 | 8/1978 | Mitchell | 51/295 |
| 4,124,401 | 11/1978 | Lee et al. | 106/44 |
| 4,151,686 | 5/1979 | Lee et al. | 51/307 |
| 4,167,399 | 9/1979 | Lee et al. | 51/307 |
| 4,228,942 | 10/1980 | Dietrich | 228/121 |
| 4,229,186 | 10/1980 | Wilson | 51/297 |
| 4,241,135 | 12/1980 | Lee et al. | 428/332 |
| 4,293,618 | 10/1981 | Hara et al. | 428/551 |
| 4,311,490 | 1/1982 | Bovenkerk et al. | 51/307 |
| 4,403,015 | 9/1983 | Nakai et al. | 428/565 |
| 4,411,672 | 10/1983 | Ishizuka | 51/309 |
| 4,604,106 | 8/1986 | Hall et al. | 51/293 |
| 4,686,080 | 8/1987 | Hara et al. | 428/565 |

FOREIGN PATENT DOCUMENTS 56-208  1/1981  Japan .

Primary Examiner—Stephen J. Lechert, Jr.
Attorney, Agent, or Firm—Burns, Doane, Swecker & Mathis

[57] ABSTRACT

A polycrystalline diamond tool comprising a diamond layer is bonded to a support body having a complex, non-plane geometry by means of a thin more than 3 μm continuous layer of a refractory material applied by PVD or CVD technique.

7 Claims, 1 Drawing Sheet

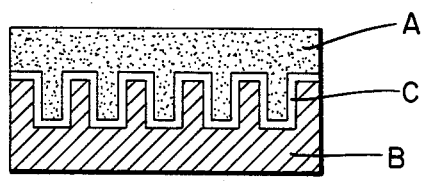
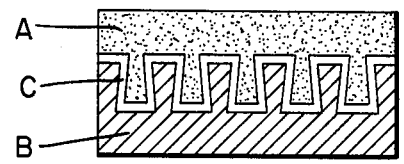
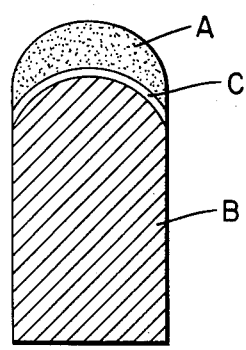
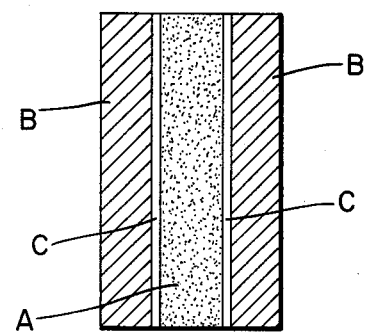

DIAMOND TOOLS FOR ROCK DRILLING AND MACHINING

The invention relates to wear and impact resistant material which is comprised of polycrystalline diamond and cemented carbide or of other combinations of hard materials.

On the market there has already been introduced a number of different high pressure-high temperature sintered tools containing polycrystalline diamond as the main ingredient. The tools are used for different purposes, among which the most important ones are rotating rock drilling (oil drilling), metal cutting and wire drawing.

The production of such polycrystalline diamond tools using high pressure-high temperature (HP/HT) technique has been described in a number of old patents, e.g.: U.S. Pat. Nos. 2,941,248, 3,141,746, 3,239,321 and 3,407,445. All these patents disclose the use of a pressure and a temperature eduring the sintering within the diamond stable phase area. Tools are described having more than 50 vol % diamond and a binder metal, e.g. Co or Ni, but no support bodies are mentioned.

In some later patents e.g. U.S. Pat. Nos. 3,745,623 and 3,767,371 high pressure-high temperature sintered polycrystalline diamond tools are described where the superhard body, containing more than 70 vol % diamond, is bonded to a body of cemented carbide.

U.S. Pat. No. 4,311,490 describes a high pressure-high temperature sintered body comprising at least two layers of diamond (or cBN) on top of each other and bonded to a body of cemented carbide.

U.S. Pat. No. 4,403,015 describes the use of intermediate layers consisting of cubic boron nitride (below 70 vol %) and one or more carbides, nitrides, carbonitrides or borides between the superhard polycrystalline diamond layer and the support body. With such layers the thermal conductivity will be reduced.

A number of other patents describe the use of intermediate layers applied as powder or foils between the diamond (cBN) layer and the support body e.g. U.S. Pat. Nos. 4,063,909, 4,108,614, 4,228,942, 4,229,186, 4,293,618 and 4,411,672.

SUMMARY OF THE INVENTION

The invention relates to high pressure, high temperature sintered bodies of diamond on a support body of cemented carbide or of other combinations of hard materials with a non-plane contact surface. Between diamond or other superhard material and support body a thin layer of preferably titanium nitride (TiN) has been applied by PVD or CVD.

BRIEF DESCRIPTION OF THE DRAWINGS

A number of examples of composites with support body with non-plane contact surfaces are given in FIGS. 1-4 in which
A refers to the diamond body,
B to the support body and
C to the titanium nitride layer.

DETAILED DESCRIPTION OF THE INVENTION

According to the invention there is provided a composite body comprising more than 50% by volume of polycrystalline diamond bonded to a support body of cemented carbide or of other combinations of hard materials in which there is an intermediate layer of titanium nitride applied by CVD or PVD. The contact surface of the support body is non-plane. Said surface can be spherical or cylindrical or be provided with depressions, recesses or grooves in a more or less regular pattern. Such a non-plane surface can not easily be provided with an intermediate layer of a foil or a powder between the support body and the polycrystalline diamond or other superhard material.

It has now surprisingly been found that a thin continuous layer of titanium nitride (TiN) thickness >3 $\mu$m, preferably about 10 $\mu$m on the support body of non-plane surface geometries (cemented carbide or another P/M material or metallic material) by use of the PVD or CVD coating techniques, preferably techniques operating at moderate substrate temperatures (below 700° C.) is sufficient to prevent diffusion into the polycrystalline diamond layer and embrittlement of the surface layer of the support body close to the diamond layer.

After coating the support with the titanium nitride layer in a PVD or CVD equipment, support body and diamond powder are sintered at high pressure (>40 kbar) and high temperature (>1000° C.) to a composite compact.

The intermediate layer technique according to the invention for sintered diamond bodies has been found to be especially valuable for support bodies with complex surface geometries where the previous thin metal foil and powder techniques are limited for technical reasons, e.g. coating of vertical and negative surfaces on support bodies with narrow strips—FIGS. 1-2 or coating of support bodies with curved surfaces—FIGS. 3-4.

In spite of the small thickness of the intermediate titanium nitride layer obtained it has been found that its continuity and stability during sintering is acting as an effective diffusion barrier of the metallic components preventing depletion of bindermetal, especially cobalt, from the support and in connection to that preventing brittleness in the underlying support material. This is particularly valid when the surface region of the support body is surrounded by diamond on three sides such as for example support bodies with narrow strips—FIGS. 1-2.

Another great advantage with the intermediate titanium nitride barrier layer between diamond and support is the effective control obtained of the quantity of catalyst (Co, Ni, Fc) added to the diamond because the whole catalyst quantity must be added to the diamond powder before sintering quite independently of the composition of underlying support material.

Hammer tests of diamond/cemented carbide specimens according to the invention has shown an excellent bonding in the interfaces between support and titanium nitride layer as well as between titanium nitride layer and diamond. The cracks pass through diamond and the cemented carbide support but never in or adjacent to the titanium nitride layer.

It has also been shown that with this thin titanium nitride layer possible with the present invention, no adverse effects on the brazing properties are obtained.

Other similar compounds or elements which can be deposited by the same techniques and which will be supposed to give about the same results as for titanium nitride are nitrides, borides and/or carbides of the elements of groups IVa, Va and/or VIa of the periodic system and B, Si and Al e.g. TaN, TiB$_2$, ZrB$_2$, AlN, Si$_3$N$_4$, AlB$_2$ and ZrN, refractory metals, solid solution e.g (Ti,Al)N and mixtures of these.

EXAMPLE 1

Cemented carbide buttons of WC-Co type (WC—13 weight-% Co) with a contact surface of complex geometry ("Claw Cutter"-type, U.S. Pat. No. 4,592,433) were coated with a 10 μm continuous titanium nitride layer by use of PVD-technique.

The titanium nitride coated buttons were then sintered at high pressure, high temperature (65 kbar/1400° C.) with a powder mixture of 94% by volume diamond and 6% by volume of cobalt.

Hammer tests of the diamond/cemented carbide composites obtained showed an excellent bonding in the interface between cemented carbide and titanium nitride layer as well as between titanium nitride layer and diamond body. The cracks passed through diamond or the cemented carbide body but never in or adjacent to the titanium nitride layer.

Brazing tests indicated no adverse effects on the brazing properties due to the presence of the intermediate titanium nitride coating.

EXAMPLE 2

Example 1 was repeated with a 20 μm W-layer with the same good results.

We claim:

1. A polycrystalline diamond tool comprising a layer of more than 50% by volume of diamond compact bonded to a support body by means of a thin, more than 3 μm continuous, metal diffusion-blocking, intermediate bonding layer of a refractory material applied by PVD or CVD technique, the coated surface of said support body having a non-plane geometry.

2. A polycrystalline diamond tool according to claim 1 wherein the refractory material is titanium nitride and the support body consists of cemented carbide.

3. A polycrystalline diamond tool according to claim 1 wherein the refractory material is titanium nitride.

4. A polycrystalline diamond tool according to claim 3 wherein the non-plane geometry comprises a series of rectangular teeth.

5. A polycrystalline diamond tool according to claim 3 wherein the non-plane geometry comprises a curved surface.

6. In a polycrystalline diamond tool comprising an outermost layer comprising more than 50 volume percent diamond bonded to a cemented carbide support wherein the support has a non-planer surface, the improvement which comprises bonding said diamond layer to said cemented carbide support through a continuous, metal diffusion-blocking thin bonding layer more than 3 μm thick of a refractory material applied by physical vapor deposition or chemical vapor deposition to said support.

7. In a polycrystalline diamond tool comprising an outermost layer comprising more than 50 volume percent diamond bonded to a cemented carbide support wherein the support has a non-planer surface, the improvement which comprises bonding said diamond layer to said cemented carbide support through a continuous thin layer more than 3 μm thick of titanium nitride applied by physical vapor deposition to said support.

* * * * *